US012738927B2

(12) United States Patent
Xu et al.

(10) Patent No.: US 12,738,927 B2
(45) Date of Patent: Sep. 15, 2026

(54) SWITCHING DEVICE AND METHOD FOR CONTROLLING THE SWITCHING DEVICE

(71) Applicant: Schneider Electric Industries SAS, Rueil-Malmaison (FR)

(72) Inventors: Jungang Xu, Shanghai (CN); Jiamin Chen, Shanghai (CN); Songxue Yan, Shanghai (CN); Siyang Feng, Shanghai (CN); Hao Zhuang, Shanghai (CN); Juan Xie, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 72 days.

(21) Appl. No.: 19/008,914

(22) Filed: Jan. 3, 2025

(65) Prior Publication Data

US 2025/0266811 A1 Aug. 21, 2025

(30) Foreign Application Priority Data

Feb. 21, 2024 (CN) ......................... 202410197039.0

(51) Int. Cl.
*H03K 3/012* (2006.01)
*H02P 9/00* (2006.01)

(52) U.S. Cl.
CPC .................................... *H03K 3/012* (2013.01)

(58) Field of Classification Search
CPC .. H03K 3/00; H03K 3/012; H02P 9/00; H02P 9/02; H02P 9/006; H02P 7/00; H02P 7/05; H02P 7/06; H02P 7/063; H02P 7/18; H02P 7/29
USPC ................................ 327/100, 103, 109, 110
See application file for complete search history.

(56) References Cited

U.S. PATENT DOCUMENTS

| | | | | |
|---|---|---|---|---|
| 6,246,562 | B1 | 6/2001 | Durif | |
| 11,843,380 | B2 * | 12/2023 | Wang | H02M 1/36 |
| 12,088,428 | B2 * | 9/2024 | Brenguier | H04L 12/10 |
| 12,125,652 | B2 * | 10/2024 | Jia | H01H 50/54 |
| 2022/0238289 | A1 | 7/2022 | Lanes | |

FOREIGN PATENT DOCUMENTS

| | | | |
|---|---|---|---|
| EP | 0353533 | A1 | 2/1990 |
| EP | 0994499 | A1 | 4/2000 |

* cited by examiner

*Primary Examiner* — Hai L Nguyen
(74) *Attorney, Agent, or Firm* — Kinney & Lange, P.A.

(57) ABSTRACT

A switching device including a coil a first switch and a second switch connected in series. The switching device includes a first diode with the anode connected to a second end of the coil; a second diode with the cathode connected to a first end of the coil; a first power supply unit, the first end of which is connected to the second end of the coil and the second end of which is connected to the low potential end, and the output end of which outputs a first supply voltage; a current detection unit, which is connected between the second end of the second switch and the low potential end; a voltage detection unit, which is connected between the high potential end and the low potential end; and a control unit. A method for controlling the switching device is also disclosed.

10 Claims, 2 Drawing Sheets

SWITCHING DEVICE AND METHOD FOR CONTROLLING THE SWITCHING DEVICE

TECHNICAL FIELD

The present disclosure relates to switching devices and a method for controlling a switching device.

BACKGROUND

Contactors and relays are used to switch on or off AC or DC circuits with loads over long distances and are mainly used to control electrical loads such as motors and transformers. Inside the contactors and relays, control circuits control the electromagnetic system that generates a magnetic field, which in turn controls the opening and closing of the contacts.

Contactors and relays can be categorized as mechanical or electronic. In mechanical contactors/relays there are usually multiple coils arranged to cope with different voltage levels. In electronic contactors/relays, the current on the coils can be regulated to actively adapt to different voltage levels. In electronic contactors/relays, in order to supply power to control circuits, such as a control chip, an IGBT (Insulated Gate Bipolar Transistor) buck chopper circuit or a TVS buck circuit can be used to reduce the high voltage on the line to a low voltage available to the control circuits and the chip. However, when the line voltage is high or the voltage input range is large, direct IGBT bucking results in excessive power consumption of the IGBTs, which requires the addition of an auxiliary heat sink. When using TVS (Transient Voltage Suppressor) circuits for voltage reduction or energy-consuming, the TVS will break down. This results in high power consumption and high temperatures, which greatly reduces the life of the power supply circuit.

BRIEF SUMMARY

The present disclosure provides a switching device that employs a coil energy bidirectional reset technology and a capacitive coupling technology, which can solve a serious problem of heat generation when an auxiliary power supply is supplied to the switching device under high voltage input conditions.

The present disclosure provides a switching device, the switching device comprises a coil, a first switch and a second switch; wherein a first end of the first switch is connected to a high potential end of an input power source and a second end of the first switch is connected to a first end of the coil; a second end of the coil is connected to a first end of the second switch and a second end of the second switch is connected to a low potential end of the input power source; the switching device further comprises a first diode, the anode of the first diode being connected to the second end of the coil and the cathode of the first diode being connected to the high potential end; a second diode, the anode of the second diode being connected to the low potential end and the cathode of the second diode being connected to the first end of the coil; a first power supply unit, a first end of the first power supply unit being connected to the second end of the coil, a second end of the first power supply unit being connected to the low potential end, and an output of the first power supply unit outputting a first supply voltage; a first energy-consuming unit, the first energy-consuming unit being connected between the second end of the second switch and the low potential end;

a second energy-consuming unit, the second energy-consuming unit being connected between the high potential end and the low potential end; a voltage detection unit, which is configured to detect an input voltage of the input power source and to feed a voltage detection signal to the control unit; and the control unit, which is configured to control the switching on and off of the first switch and to control the switching on and off of the second switch within a time period during which the first switch is switched off in response to the input voltage being greater than a pre-given voltage threshold; wherein the first supply voltage is less than the input voltage.

In an embodiment according to the present disclosure, the first power supply unit comprises: a first capacitor, a second capacitor, a third capacitor, a first Zener diode and a third diode; wherein the first capacitor is connected in series with the second capacitor, a first end of the first capacitor is connected to the second end of the coil, a second end of the second capacitor is connected to the low potential end, the third diode is connected in series with the first Zener diode and connected in parallel to the second capacitor, the third capacitor is connected in parallel with the first Zener diode, the cathode of the third diode is connected to the cathode of the first Zener diode, the anode of the first Zener diode is connected to the low potential end, and the cathode of the first Zener diode is connected to the output of the first power supply unit.

In an embodiment according to the present disclosure, the switching device further comprises a second Zener diode, wherein the anode of the second Zener diode is connected to the second end of the second switch, and the cathode of the second Zener diode is connected to the second end of the first capacitor.

In an embodiment according to the present disclosure, the switching device further comprises a second power supply unit, which is configured to convert the input voltage to a second supply voltage; wherein the second supply voltage is less than the input voltage; wherein the control unit is configured to control the second power supply unit to output the second supply voltage in response to the input voltage being less than the voltage threshold, and the control unit is configured to control the first power supply unit to output the first supply voltage in response to the input voltage being greater than the voltage threshold.

In an embodiment according to the present disclosure, the control unit controls the duty cycle of the first switch by means of pulse width modulation.

In an embodiment according to the present disclosure, the switching device further comprises a current detection unit, which is configured to detect the current flowing through the coil and to feed a current detection signal to the control unit, wherein the control unit is configured to control the switching on and off of the first switch based on the current detection signal.

In an embodiment according to the present disclosure, the first energy-consuming unit is constructed as a current sampling resistor, and the current detection unit comprises the current sampling resistor and a first filter circuit connected in parallel with the current sampling resistor.

In an embodiment according to the present disclosure, the second energy-consuming unit is constructed as a voltage sampling resistor, and the voltage detection unit comprises the voltage sampling resistor and a second filter circuit connected in parallel with the voltage sampling resistor.

In an embodiment according to the present disclosure, the switching device further comprises a rectification unit, which is configured to convert the alternating current of the input power source into direct current.

In an embodiment according to the present disclosure, the first switch and/or the second switch are constructed as MOSFETs (metal oxide semiconductor field effect transistor).

The present disclosure also provides a method for controlling a switching device according to the present disclosure, wherein the control unit controls the switching on and off of the first switch by means of pulse width modulation, thereby controlling the magnitude of the current flowing through the coil; wherein the control unit controls the second switch to switch off and on within a time period in which the first switch is off in response to the input voltage being greater than the voltage threshold.

The switching device according to the present disclosure can be a contactor or a relay, which is arranged in an electrical line and can be applied to a wide voltage range. If a control unit in the switching device determines that the line voltage is in the large voltage range, the control unit controls the second switch to switch off when the first switch is in the off state. In the case where the first switch is off and the second switch is off, the coil acts as an inductor to release energy and generate a current. On the one hand, the coil current flows to the first power supply unit and can flow back to the coil through the second diode. The first power supply unit can consume the energy released by the coil and can provide a first supply voltage. On the other hand, the coil current flows along the first diode to the voltage detection unit and can flow back to the coil through the second diode. The voltage detection unit can also consume the energy released by the coil. Thus, a bidirectional energy release is realized. In the case where the first switch is switched off and, in the case where the second switch is switched on, the coil current flows through the second switch and the current detection unit, and can flow back to the coil through the second diode. The current detection unit can continue to consume the energy released by the coil. The switching device according to the present disclosure uses multiple paths to release energy from the coil, which is more efficient and has a lower cost, while improving the robustness and lifetime of the overall circuit.

BRIEF DESCRIPTION OF DRAWINGS

In order to more clearly illustrate the technical solutions of the embodiments of the present disclosure, the accompanying drawings to be used in the description of the embodiments will be briefly described below. Obviously, the drawings in the following description are only some exemplary embodiments of the present disclosure, and for a person of ordinary skill in the art, other embodiments can be obtained based on these embodiments without creative labor.

DETAILED DESCRIPTION

In order to make the objects, technical solutions and advantages of the present disclosure more apparent, embodiments according to the present disclosure will be described in detail below with reference to the accompanying drawings. Obviously, the embodiments described are only a part of the embodiments of the present disclosure and not all of the embodiments of the present disclosure, and it should be understood that the present disclosure is not limited by the example embodiments described herein.

In this specification and the accompanying drawings, substantially the same or similar steps and elements are indicated by the same or similar reference signs, and repetitive descriptions of these steps and elements will be omitted. Also, in the description of the present disclosure, the terms "first," "second," and the like are used only to distinguish descriptions and are not to be understood as indicating or implying relative importance or ordering.

In this specification and the accompanying drawings, elements are described in singular or plural form, depending on the embodiment. However, the singular and plural forms have been appropriately selected for use in the presented embodiments solely for ease of interpretation and are not intended to limit the present disclosure. Thus, the singular form can include the plural form, and the plural form can include the singular form, unless the context clearly indicates otherwise. In embodiments of the present disclosure, unless expressly stated otherwise, "connected" does not mean that there must be a "direct connection" or "direct contact", but only electrical connectivity is required.

The switching device may, e.g., be a contactor or a relay, which is usually mounted on a low-voltage circuit, which is a voltage range of a few hundred volts to ten kilovolts. In order to power the control circuits or chips in the switching device, it is usually necessary to convert the low voltage to a micro-voltage of, e.g., around 15V. For this purpose, it is often necessary to use IGBTs or TVSs (Transient Voltage Suppressor) with large power ratings for voltage reduction. However, such switching devices are expensive and consume high amounts of energy.

Figure 1:
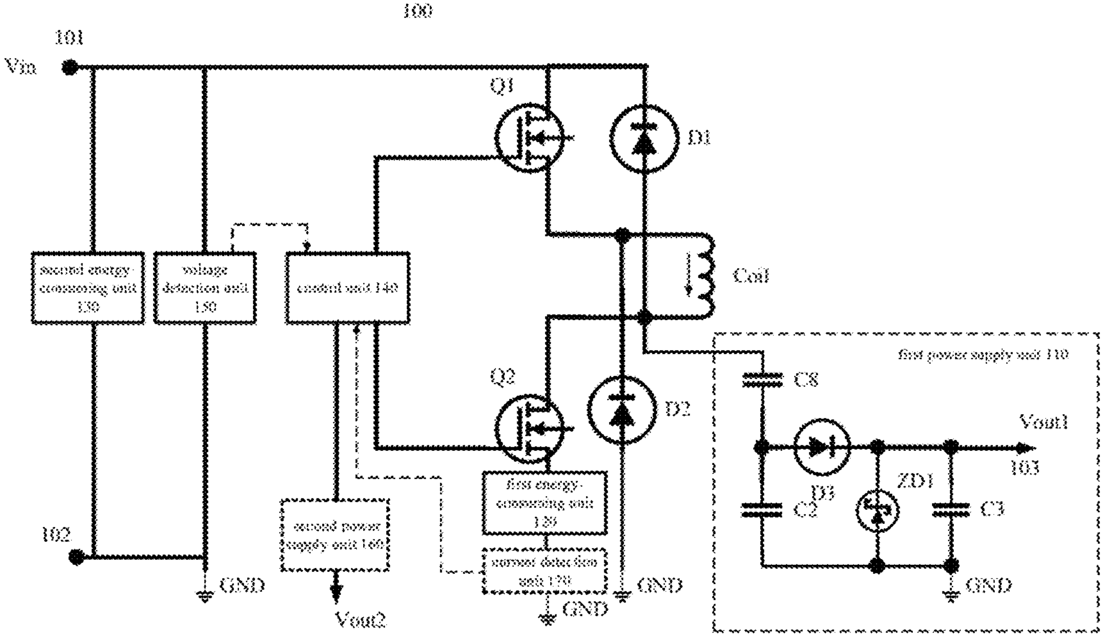
FIG. 1 illustrates a schematic circuit diagram of a switching device according to an embodiment of the present disclosure.

The present disclosure proposes a scheme for generating a micro-voltage based on a coil in a switching device in order to supply power to an element such as a chip in the switching device. FIG. 1 illustrates a schematic circuit diagram of a switching device 100 according to an embodiment of the present disclosure. The switching device 100 can convert a larger input voltage of several hundred volts to a smaller supply voltage of, e.g., 15 V to power a control unit 140 and a chip in the switching device 100.

In FIG. 1, the switching device 100 is connected to a high potential end 101 and a low potential end 102 of an input power source (not shown). The input power source is, e.g., an electrical line. In embodiments of the present disclosure, the low potential end 102 can, e.g., be the ground GND. Ground GND should be understood to be a reference potential. The voltage or potential referred to in the present disclosure is a voltage or potential relative to the low potential end, i.e., ground GND. In an embodiment according to the present disclosure, the input voltage Vin of the input power source, i.e., the voltage on the electrical line, can vary over a wide range of voltages, e.g., over a range of 200V to 500V. The switching device 100 comprises a coil Coil, which generates a magnetic field and controls the suction and release of the contacts of the switching device to control the energization of the corresponding electrical line, a first switch Q1 and a second switch Q2. The first end of the first switch Q1 is connected to the high potential end 101. The second end of the first switch Q1 is connected to the first end of the coil Coil. The second end of the coil Coil is connected to the first end of the second switch Q2, and the second end of the second switch Q2 is connected to the ground GND. In other words, the first switch Q1, the coil Coil and the second switch Q2 are connected in series between the high potential end 101 and the ground GND. In the embodiment shown in FIG. 1 and FIG. 2, the first end of the corresponding element refers to the upper end of the corresponding element, and the second end of the corresponding element refers to the lower end of the corresponding element. In an embodiment according to the present disclosure, the first switch Q1 and/or the second switch Q2 can, e.g., be constructed as a MOSFET (Metal Oxide Semiconductor Field Effect Transistor) or other electronic switches.

In the present disclosure, the switching device 100 further comprises a first diode D1 and a second diode D2. An anode of the first diode D1 is connected to a second end of the coil Coil, and a cathode of the first diode D1 is connected to the high potential end 101. The anode of the second diode D2 is connected to the ground GND, and the cathode of the second diode D2 is connected to the first end of the coil Coil. The first diode D1 and the second diode D2 are able to provide additional release paths for the energy release from the coil Coil, which will be described in more detail later. The switching device 100 further comprises a first power supply unit 110, a first energy-consuming unit 120, a second energy-consuming unit 130, a control unit 140, and a voltage detection unit 150. A first end of the first power supply unit 110 is connected to the second end of the coil Coil, a second end of the first power supply unit 110 is connected to the ground GND, and an output 103 of the first power supply unit 110 outputs a first supply voltage Vout1. The first power supply voltage is used to power the control unit 140, the chip, the driver, and other components in the switching device 100. The first power supply voltage Vout1 is less than the input voltage Vin of the high potential end 103. The first power supply voltage Vout1 can be, e.g., 15 V. The first power consumption unit 120 is connected between the second end of the second switch Q2 and the ground GND. The first energy-consuming unit 120 can comprise a resistor to consume electrical energy. The second energy-consuming unit 130 is connected between the high potential end 101 and the ground GND. The second energy-consuming unit 130 can include a resistor to consume the electrical energy. A voltage detection unit 150 is used to detect a voltage Vin of the input power source and feed a voltage detection signal to a control unit 140. The control unit 140 is used to control the second switch Q2 to switch off and on within a time period in which the first switch Q1 is off, when the input voltage Vin is greater than a pre-given voltage threshold.

In an embodiment according to the present disclosure, the switching device 100 can also comprise a second power supply unit 160. The second power supply unit 160 is used to convert the input voltage Vin to a second supply voltage Vout2. The second supply voltage is likewise used to power components such as the control unit 140, the chip, the driver and the like in the switching device 100. The second supply voltage Vout2 is less than the input voltage Vin of the high potential end 101 and the second supply voltage Vout2 can be equal to the first supply voltage Vout1, e.g. also 15 V. The switching device according to the present disclosure can be applied over a large input voltage range, e.g. can be applied over an input voltage range from 200 V to 500 V. The second supply voltage Vout2 can be equal to the first supply voltage Vout1. A voltage threshold can be given in advance, for example. If the input voltage Vin is less than the voltage threshold, the control unit 140 controls the second power supply unit 160 to output a second supply voltage Vout2, and if the input voltage Vin is greater than the voltage threshold, the control unit 140 controls the first power supply unit 110 to output a first supply voltage Vout1.

In an embodiment according to the present disclosure, the control unit 140 can control a duty cycle of the first switch Q1 in a Pulse Width Modulation (PWM) manner. The duty cycle represents a ratio of an on-time to a period of the switch, with one on-time and one off-time constituting a period. In an embodiment according to the present disclosure, the control unit 140 can further comprise a current detection unit 170. The current detection unit 170 is used to detect the current flowing through the coil Coil and feed the current detection signal to the control unit 140, which controls the switching on and off of the first switch Q1 based on the current detection signal. The control unit 140 can employ e.g., PI regulation or PID regulation and adjust the duty cycle of the first switch Q1 according to the acquired current detection signal. The control unit 140 controls the switching on and off of the first switch Q1 to regulate the magnitude of the current flowing through the coil Coil. The magnitude of the current flowing through the coil Coil affects the magnitude of the magnetic field formed in the coil Coil, and consequently affects the magnitude of the suction force of the contacts in the switching device 100. In this way, the switching device 100 can be suitable for different applications.

In an embodiment according to the present disclosure, the control unit 140 controls the switching on and off of the first switch Q1 in a PWM manner. The second switch Q2 remains on, when the input voltage Vin of the switching device 100 is less than a voltage threshold, i.e., the input voltage Vin is small. The second power supply unit 160 can convert the smaller input voltage Vin to a second supply voltage Vout2. The second supply voltage Vout2 is used to power chips in the switching device 100. When the input voltage Vin of the switching device 100 is greater than a voltage threshold, i.e. the input voltage Vin is large, the second power supply unit 160 cannot convert the larger input voltage Vin into a micro-voltage available to the chip. In this case, the control unit 140 controls the second switch Q2 to switch off and on within the time period in which the first switch Q1 is off.

In the case where the first switch Q1 is switched off and the second switch Q2 is switched off, the coil Coil acts as an inductor to release energy and generate a current. In FIG. 1, the direction of the current in the coil Coil is shown with an arrow from top to bottom. On the one hand, the current flows to the first power supply unit 110 and can flow back to the coil Coil via the second diode D2, ultimately forming a loop. The first power supply unit 110 can consume the energy released by the coil Coil and can provide a first supply voltage Vout1. At this time, the second power supply unit 160 stops supplying power. On the other hand, the current flows along the first diode D1 to the second energy-consuming unit 130 and can flow back to the coil Coil through the second diode D2, ultimately forming a loop. The second energy-consuming unit 130 can also consume the energy released by the coil Coil. Thus, a dual path of energy release and energy consumption is realized.

In the case where the first switch Q1 is off and the second switch Q2 is on, the coil current flows through the second switch Q2 and the first energy-consuming unit 120 and can flow back to the coil Coil through the second diode D2, ultimately forming a loop. The first energy-consuming unit 120 and possibly the current detection unit 170 can continue to consume the energy released by the coil Coil. The switching device according to the present disclosure uses multiple paths to release energy from the coil, which is more efficient and has a lower cost, while improving the robustness and lifetime of the overall circuit.

In an embodiment according to the present disclosure, the first power supply unit 110 can be constructed in the circuit shown in FIG. 1. The first power supply unit 110 can comprise a first capacitor C1, a second capacitor C2, a third capacitor C3, a first Zener diode ZD1 and a third diode D3. The first capacitor C1 is connected in series with the second capacitor C2, the first end of the first capacitor C1 is connected to the second end of the coil Coil, the second end of the second capacitor C2 is connected to the ground GND, the third diode D3 is connected in series with the first Zener diode ZD1 and in parallel to the second capacitor C2, the third capacitor C3 is connected in parallel with the first Zener diode ZD1, the cathode of the third diode D3 is connected to the cathode of the first Zener diode ZD1, the anode of the first Zener diode ZD1 is connected to the ground GND, and the cathode of the first Zener diode ZD1 is connected to the output terminal 103 of the first power supply unit 110.

The first capacitor C1 and the second capacitor C2 are connected in series between the second end of the coil Coil and the ground GND. The first capacitor C1 and the second capacitor C2 enable capacitive coupling (voltage splitting) and can prevent a constant DC component from flowing through the first power supply unit 110, thereby preventing damage to individual components in the first power supply unit 110. The voltage divider on the second capacitor C2 is used to generate a first supply voltage Vout1. A third diode D3 is used to restrict the flow direction of the current so that the current flows from the connection point of the first capacitor C1 and the second capacitor C2 to the output terminal 103. A first Zener diode ZD1 is used to stabilize the first supply voltage Vout1 at the output terminal 103 to a desired value. In the case where a supply voltage of e.g., 15V is desired to be provided, the first Zener diode ZD1 can be a Zener diode slightly larger than the supply voltage, such as a 16V Zener diode. The third capacitor C3 is used to keep the voltage on the first Zener diode ZD1 or the first supply voltage Vout1 stabilized.

Figure 2:
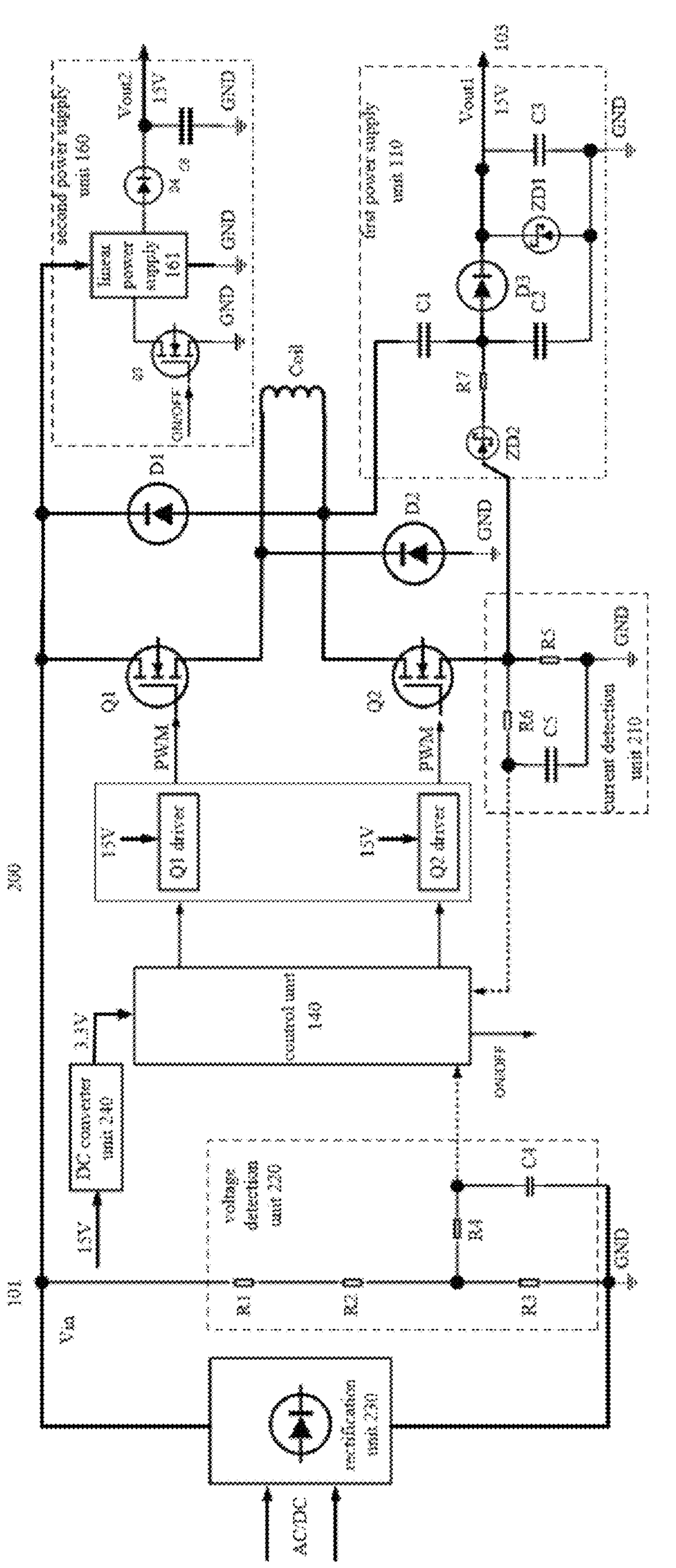
FIG. 2 illustrates a schematic circuit diagram of a switching device according to another embodiment of the present disclosure.

FIG. 2 illustrates a schematic circuit diagram of a switching device 200 according to another embodiment of the present disclosure. The embodiment shown in FIG. 2 illustrates a preferred circuit structure of the switching device 200.

In the embodiment shown in FIG. 2, the switching device 200 can comprise a second Zener diode ZD2. An anode of the second Zener diode ZD2 is connected to a second end of the second switch Q2, and a cathode of the second Zener diode ZD2 is connected to a second end of the first capacitor C1, i.e., to a connection point of the first capacitor C1 and the second capacitor C2. Additionally, e.g., a resistor R7 can be present, which is connected in series with the second Zener diode ZD2. The second Zener diode ZD2 is used to clamp the voltage on the series circuit comprising the second switch Q2 and the first capacitor C1, so as to avoid the second switch Q2 being damaged due to an excessive voltage on the second switch Q2.

In an embodiment according to the present disclosure, the second energy-consuming unit is constructed as a voltage sampling resistor R3, and the voltage detection unit 220 comprises the voltage sampling resistor R3 and a second filter circuit connected in parallel with the voltage sampling resistor R3, which comprises a fourth resistor R4 and a fourth capacitor C4. The voltage detection unit 220 is connected between the high potential end 101 and the ground GND. Specifically, the voltage detection unit 220 can comprise, e.g., a first resistor R1, a second resistor R2, a third resistor R3, a fourth resistor R4, and a fourth capacitor C4. The first resistor R1, the second resistor R2, and the third resistor R3 are connected in series, and the series circuit comprising the fourth resistor R4 and the fourth capacitor C4 is connected in parallel with the third resistor. The third resistor R3 forms a voltage sampling resistor. The input voltage Vin can be determined based on the voltage dividing on the third resistor R3. The fourth resistor R4 and the fourth capacitor C4 form an RC filter circuit, i.e., a second filter circuit. The RC filter circuit eliminates the high-frequency noise, and the control unit 140 can thus more accurately determine the magnitude of the input voltage Vin.

In an embodiment according to the present disclosure, the first energy-consuming unit can be constructed, e.g., as a current sampling resistor R5, and the current detection unit 210 comprises the current sampling resistor R5 and a first filter circuit connected in parallel with the current sampling resistor R5, which comprises a sixth resistor R6 and a fifth capacitor C5. The current detection unit 210 is connected between a second end of the second switch Q2 and the ground GND. The current detection unit 210 can comprise e.g., a fifth resistor R5, a sixth resistor R6, and a fifth capacitor C5. The fifth resistor R5 is connected between the second end of the second switch Q2 and the ground GND. A series circuit formed by the sixth resistor R6 and the fifth capacitor C5 is connected in parallel with the fifth resistor R5. The fifth resistor R5 forms a current sampling resistor. The magnitude of the current flowing through the coil Coil can be determined based on the partial voltage across the fifth resistor R5. The sixth resistor R6 and the fifth capacitor C5 form an RC filter circuit, i.e., a second filter circuit. The RC filter circuit can eliminate high-frequency noise, and the control unit 140 can therefore more accurately determine the magnitude of the current flowing through the coil Coil.

In an embodiment according to the present disclosure, the switching device 200 can comprise a rectification unit 230. The rectification unit 230 is connected between the high potential end 101 and the ground GND. The rectification unit 230 is used to convert the incoming AC power to DC power. In the presence of the rectification unit 230, the switching device 200 can be applied both in a DC line and in an AC line. When the switching device 200 is applied in an AC line, the rectification unit 230 converts the input AC power to DC power for a buck operation of the first power supply unit 110 or the second power supply unit 160 and outputs a suitable supply voltage, e.g., a 15V supply voltage.

In an embodiment according to the present disclosure, the switching device 200 can comprise e.g., a DC converter unit 240. The DC converter unit 240 converts the supply voltage provided by the first power supply unit 110 or the second power supply unit 160 into a voltage available to the control unit 140, and can convert a supply voltage of 15 V into e.g., 3.3 V, which is available to the control unit 140.

In an embodiment according to the present disclosure, the second power supply unit 160 can comprise e.g., a linear power supply 161 that can convert the input voltage Vin to a second supply voltage, e.g., a voltage of 15 V, which can be used to supply power to the control unit 140 or other chips. In addition, as shown in FIG. 2, the second power supply unit 160 can also comprise e.g. a sixth capacitor C6 and a fourth diode D4. The sixth capacitor C6 is used to stabilize the power supply voltage of the second power supply unit. The fourth diode D4 is used to limit the current flow. The control unit 140 can, e.g., control whether or not the second power supply unit 160 is supplied with power via the third switch Q3. The control signal issued by the control unit 140 to the second power supply unit 160 is shown in FIG. 2 by ON/OFF.

The control unit 140 outputs control signals in order to facilitate the control of the first switch Q1 and the second switch Q2. The control signals can be amplified by the corresponding drivers (Q1 driver and Q2 driver) and output to the control terminals of the first switch Q1 and the second switch Q2, such as the gates of the first switch Q1 and the second switch Q2 constructed as a MOSFET in order to control the first switch Q1 and the second switch Q2 of the first switch Q1 and the second switch Q2. The supply voltage provided by the first power supply unit 110 or the second power supply unit 160 can be provided to the corresponding drivers (Q1 driver and Q2 driver). The control unit 140 can also output a control signal to control whether the second power supply unit 160 outputs the second supply voltage. The second power supply unit 160 can comprise e.g., a third switch. If the input voltage Vin is less than a specified voltage threshold, the control unit 140 controls the third switch to switch on to cause the second power supply unit 160 to supply power, and if the input voltage Vin is greater than the specified voltage threshold, the control unit 140 controls the third switch to switch off to cause the second power supply unit 160 to stop supplying power.

The switching device according to the present disclosure can be a contactor or a relay, which is arranged in the electrical line and can be applied in a wide range of voltages, e.g. in a voltage range of 200V to 500V. In the switching device according to the present disclosure, the voltage detection unit 220 is used to detect whether an abnormality occurs in the voltage in the electrical line, e.g., whether there is an overvoltage or an undervoltage, and the current detection unit 210 is used to detect whether an abnormality occurs in the current in the electrical line, e.g., whether there is an overcurrent. When an abnormality occurs in the voltage or the current in the electrical line, the control unit 140 can issue a shutdown signal to shut down the first switch Q1 and the second switch Q2. The coil Coil is thus deprived of power supply and is no longer provided with a magnetic field. The contacts in the switching device can thus be disconnected and cut off the electrical line. In the present disclosure, the control unit 140 and other elements of the switching device can be supplied with power either by the first power supply unit 110 or by the second power supply unit 160. If the control unit 140 determines that the voltage of the electrical line is in a low voltage range, such as in the range of 200V to 400V, the control unit 140 controls the second power supply unit 160 to supply power. If the control unit 140 determines that the voltage of the line is in the large voltage range, e.g., in the range of 400V to 500V, the control unit 140 stops the power supply of the second power supply unit 160 and controls the second switch Q2 to switch off when the first switch Q1 is in the off state. At this time, the first power supply unit 110 can supply power instead of the second power supply unit 160, for example, to generate a supply voltage of 15V. This power supply can be provided directly to the control unit 140 and other components or can be provided after voltage conversion. In addition, the switching device of the present disclosure is able to utilize the circuit design described in detail earlier to consume the additional energy from the high voltage, thereby preventing the high voltage from damaging the electronic switching devices in the switching device. When the voltage of the electrical line returns to the low voltage range, the control unit 140 controls the second switch Q2 to switch on and the second power supply unit 160 to supply power.

The control unit 140 controls the switching on and switching off of the first switch Q1 by means of pulse width modulation. The second switch Q2 is switched off and on within the time period in which the first switch Q1 is switched off. Thus, the control unit 140 can also control the switching on and switching off of the first switch Q2 by means of pulse width modulation. The first switch Q1 and the second switch Q2 have different duty cycles.

The block diagrams of the circuits, units, devices, apparatuses, equipment, and systems involved in this disclosure are intended as exemplary examples only and do not purport to require or imply that they must be connected, arranged, or configured in the manner illustrated in the block diagrams. As those skilled in the art will recognize, the circuits, units, devices, apparatuses, equipment, and systems can be connected, arranged, and configured in any manner as long as they are capable of achieving the desired purpose. The circuits, units, devices, appliances involved in this disclosure can be implemented in any suitable manner, such as by using special-purpose integrated circuits, field programmable gate arrays (FPGAs), etc., or by using a general-purpose processor in combination with a program.

It should be understood by those skilled in the art that the above specific embodiments are only examples and not limitations, and various modifications, combinations, partial combinations, and substitutions of the embodiments of the present disclosure can be made according to design needs and other factors, as long as they are within the scope of the appended claims or their equivalents, which fall within the scope of the rights that the present disclosure is intended to protect.

What is claimed is:

1. A switching device, comprising:

a coil, a first switch and a second switch;

wherein a first end of the first switch is connected to a high potential end of an input power source and a second end of the first switch is connected to a first end of the coil; a second end of the coil is connected to a first end of the second switch and a second end of the second switch is connected to a low potential end of the input power source;

the switching device further comprises:

a first diode, the anode of the first diode being connected to the second end of the coil and the cathode of the first diode being connected to the high potential end;

a second diode, the anode of the second diode being connected to the low potential end and the cathode of the second diode being connected to the first end of the coil;

a first power supply unit, a first end of the first power supply unit being connected to the second end of the coil, a second end of the first power supply unit being connected to the low potential end, and an output of the first power supply unit outputting a first supply voltage;

a first energy-consuming unit, the first energy-consuming unit being connected between the second end of the second switch and the low potential end;

a second energy-consuming unit, the second energy-consuming unit being connected between the high potential end and the low potential end;

a voltage detection unit, which is configured to detect an input voltage of the input power source and to feed a voltage detection signal to a control unit; and the control unit, which is configured to control the switching on and off of the first switch and to control the switching on and off of the second switch within a time period during which the first switch is switched off in response to the input voltage being greater than a pre-given voltage threshold;

wherein the first supply voltage is less than the input voltage.

2. The switching device according to claim 1, wherein the first power supply unit comprises:

a first capacitor, a second capacitor, a third capacitor, a first Zener diode and a third diode;

wherein the first capacitor is connected in series with the second capacitor, a first end of the first capacitor is connected to the second end of the coil, a second end of the second capacitor is connected to the low potential end, the third diode is connected in series with the first Zener diode and connected in parallel to the second capacitor, the third capacitor is connected in parallel with the first Zener diode, the cathode of the third diode is connected to the cathode of the first Zener diode, the anode of the first Zener diode is connected to the low potential end, and the cathode of the first Zener diode is connected to the output of the first power supply unit.

3. The switching device according to claim 2, wherein the switching device further comprises:

a second Zener diode, wherein the anode of the second Zener diode is connected to the second end of the second switch, and the cathode of the second Zener diode is connected to the second end of the first capacitor.

4. The switching device according to claim 1, wherein the switching device further comprises:

a second power supply unit, which is configured to convert the input voltage to a second supply voltage;

wherein the second supply voltage is less than the input voltage;

wherein the control unit is configured to control the second power supply unit to output the second supply voltage in response to the input voltage being less than the voltage threshold, and the control unit is configured to control the first power supply unit to output the first supply voltage in response to the input voltage being greater than the voltage threshold.

5. The switching device according to claim 1, wherein the control unit is configured to control the duty cycle of the first switch by means of pulse width modulation.

6. The switching device according to claim 1, wherein the switching device further comprises:

a current detection unit, which is configured to detect the current flowing through the coil and to feed a current detection signal to the control unit, wherein the control unit is configured to control the switching on and off of the first switch based on the current detection signal.

7. The switching device according to claim 6, wherein the first energy dissipating unit is constructed as a current sampling resistor, and the current detection unit comprises the current sampling resistor and a first filter circuit connected in parallel with the current sampling resistor.

8. The switching device according to claim 1, wherein the second energy-consuming unit is constructed as a voltage sampling resistor, and the voltage detection unit comprises the voltage sampling resistor and a second filter circuit connected in parallel with the voltage sampling resistor.

9. The switching device according to claim 1, wherein the switching device further comprises:

a rectification unit, which is configured to convert the alternating current of the input power source into direct current.

10. A method for controlling a switching device according to claim 1, wherein the control unit controls the switching on and off of the first switch by means of pulse width modulation, thereby controlling the magnitude of the current flowing through the coil;

wherein the control unit controls the second switch to switch off and on within a time period in which the first switch is off in response to the input voltage being greater than the voltage threshold.

* * * * *